(12) United States Patent
Wang

(10) Patent No.: US 9,048,137 B2
(45) Date of Patent: Jun. 2, 2015

(54) SCALABLE GATE LOGIC NON-VOLATILE MEMORY CELLS AND ARRAYS

(75) Inventor: Lee Wang, Diamond Bar, CA (US)

(73) Assignee: FLASHSILICON INCORPORATION, Diamond Bar, CA (US)

(*) Notice: Subject to any disclaimer, the term of this patent is extended or adjusted under 35 U.S.C. 154(b) by 95 days.

(21) Appl. No.: 13/399,753

(22) Filed: Feb. 17, 2012

(65) Prior Publication Data

US 2013/0214341 A1    Aug. 22, 2013

(51) Int. Cl.
*H01L 27/115* (2006.01)
*G11C 16/04* (2006.01)

(52) U.S. Cl.
CPC ...... *H01L 27/11558* (2013.01); *G11C 16/0483* (2013.01); *H01L 27/115* (2013.01)

(58) Field of Classification Search
CPC .................. H01L 27/11558; H01L 27/11519; H01L 29/66825; G11C 16/0483
USPC .................................................. 257/316, 318
See application file for complete search history.

(56) References Cited

U.S. PATENT DOCUMENTS

| | | | |
|---|---|---|---|
| 5,301,150 A | 4/1994 | Sullivan et al. | |
| 5,504,706 A | 4/1996 | D'Arrigo et al. | |
| 5,736,764 A * | 4/1998 | Chang ........................... | 257/318 |
| 6,191,980 B1 | 2/2001 | Kelley et al. | |
| 6,329,240 B1 * | 12/2001 | Hsu et al. ...................... | 438/253 |
| 6,696,724 B2 | 2/2004 | Verhaar | |
| 7,019,353 B2 * | 3/2006 | Lindsay et al. ................ | 257/315 |
| 7,800,156 B2 | 9/2010 | Roizin et al. | |
| 2007/0257299 A1 * | 11/2007 | Chen et al. ..................... | 257/315 |
| 2008/0112231 A1 * | 5/2008 | Shum ........................ | 365/185.27 |
| 2011/0157974 A1 | 6/2011 | Lee | |
| 2012/0299079 A1 * | 11/2012 | Wang ............................ | 257/316 |
| 2013/0178026 A1 * | 7/2013 | Wang ............................ | 438/258 |

OTHER PUBLICATIONS

Ohsaki, et al., "A Single Poly EEPROM Cell Structure for Use in Standard CMOS Processes", IEEE Journal of Solid-State Circuits, vol. 29, No. 3, Mar. 1994, pp. 311-316.

* cited by examiner

*Primary Examiner* — Tucker Wright
(74) *Attorney, Agent, or Firm* — Muncy, Geissler, Olds & Lowe, P.C.

(57) ABSTRACT

Scalable Gate Logic Non-Volatile Memory (SGLNVM) devices fabricated with the conventional CMOS process is disclosed. Floating gates of SGLNVM with the minimal length and width of the logic gate devices form floating gate Metal-Oxide-Semiconductor Field Effect Transistor. The floating gates with the minimal gate length extend over silicon active areas to capacitively couple control gates embedded in silicon substrate (well) through an insulation dielectric. The embedded control gate is formed by a shallow semiconductor type opposite to the type of the silicon substrate or well. Plurality of SGLNVM devices are configured into a NOR-type flash array where a pair of SGLNVM devices share a common source electrode connected to a common ground line with two drain electrodes connected to two separate bitlines. The pairs of the NOR-type SGLNVM cells are physically separated and electrically isolated by dummy floating gates to minimize cell sizes.

17 Claims, 21 Drawing Sheets

SCALABLE GATE LOGIC NON-VOLATILE MEMORY CELLS AND ARRAYS

BACKGROUND OF THE INVENTION

1. Field of the Invention

This invention relates to logic semiconductor Non-Volatile Memory (NVM) cell devices and their cell array arrangement. The disclosed logic semiconductor NVM cell can be processed with the conventional CMOS process with a single layer of logic gate as the charge storing material. In particular, scalable gate logic Non-Volatile Memory (SGLNVM) cell devices are formed by the minimal gate length and width of logic gate devices and the control gates of the logic semiconductor NVM cells are formed by a shallow semiconductor embedded in the substrate (well) with its type opposite to the type of the substrate (well). The SGLNVM flash array is configured by pairs of NOR-type SGLNVM cell devices separated by dummy floating gates to minimize the array sizes.

2. Description of the Related Art

Complementary Metal-Oxide Semiconductor (CMOS) process becomes the most popular fabrication process for Application Specific Integrated Circuit (ASIC). An ASIC contains the specific functionality of a device or a system on a single Integrated Circuit (IC) or a chip. In digital age almost all electronic devices or equipments are controlled and operated by IC chips. Changes for the specific functionality or configuration are required for many various applications. For examples, the initial programming and configuring a microprocessor require a programmable non-volatile memory to store the programmed instructions. The non-volatile memory retains its stored digital information, even when the powers for the electronic systems are "off". The stored digital information or instructions can be recalled, when the electronic system are turned on. Furthermore, the programmable instructions shall be allowed to change any time without changing the hardware during developments. Those requirements for electronic systems are done by Electrically Erasable Programmable Read-Only Memory (EEPROM) devices. EEPROM is a semiconductor NVM capable of being erased and programmed by applying electrical voltage biases to the electrodes of memory devices. EEPROM are usually operated cell-by-cell basis. Thus, EEPROM requires an access MOSFET to access the storing memory cell. In general, EEPROM are at least two-transistor (2T) memory cell (access transistor+storing transistor). Electrical Programmable Read-Only Memory (EPROM) is another kind of semiconductor NVM with a single unit of storing transistor (1T) without the access transistor. However, EPROM requires Ultra-Violate (UV) light for erase operation. In later development, EEPROM based on the single transistor EPROM (1T) array architecture has been specifically configured into flash EEPROM that may be electrically erased on a global basis, that is, page-by-page or sector-by-sector.

In the conventional EEPROM fabrication process, the control gates of EEPROM memory cells are fabricated above an isolated conductive layer so-called "floating gate" or a stack of dielectric layers like Oxide-Nitride-Oxide (ONO) for storing electrical charges on top of silicon channel surfaces. In contrast to the conventional CMOS process broadly applied to most ASIC fabrications, only one conducting gate layer is fabricated for the control gates of logic MOSFET devices. The fabrication process for the extra charge storing layers requires several process steps such as film deposition, etching, and photolithography for patterning. These additional process steps result in fabrication cost increases, process complexity, circuit yield impact, and longer process time. Thus, EEPROM cells processed with no extra storage layer and compatible with CMOS baseline process are very desirable for embedded EEPROM ASICs.

The first single-poly floating gate EEPROM cell device processed with the conventional CMOS process was demonstrated and reported by Ohsaki et al. in 1994, IEEEE Journal of Solid-state Circuit, Vol. 29, No. 3, March 1994, pp. 311-316. As shown in FIG. 1a, the source, drain, and N-type well electrodes of a P-type MOSFET 11 in CMOS are connected altogether to form the control gate of the EEPROM device 10 and the gates of the CMOS without connecting to any external electrodes form the floating gate of the EEPROM device 10 for storing charges. The source, drain, and substrate electrodes of the N-type MOSFET 12 in the CMOS form the source, drain, and substrate electrodes of the EEPROM device 10, respectively. However, the array architecture of the original devices shown in FIG. 1b suffers the drawbacks of high programming voltages and currents, high voltage erase operation, and a slow complicate read access. Those issues for flash EEPROM occurs very common in the so-called "virtual ground" array architecture. Due to the poor performance of programming and erase, the programming/erase disturbances are severe and the numbers of program/erase cycling was very low. To resolve the poor programming/erase performance, device technologists began to add more structures to remedy those issues. For example, U.S. Pat. No. 6,191,980 to Kelly et al. applies an extra-capacitor to increase the control gate capacitive coupling for erase operation; U.S. Pat. No. 5,301,150 to Sullivan et al. applies a large N-type well to increase the control gate capacitive coupling; U.S. Pat. No. 5,504,706 to D'Arrigo et al. applies triple-wells to the N-type MOSFET for negative voltage operation, and an extra-implant process to form a heavy doped n-type control gate in the single-poly EEPROM cells; U.S. Pat. No. 6,329,240 to Hsu et al. applies a crown capacitor to increase the control gate capacitive coupling for a P-type EEPROM device. U.S. Pat. No. 7,800,156 to Roizin et al. applies asymmetrical high voltage and low voltage transistors for forming the single-poly EEPROM cells. However, adding structures to the single-ploy NVM cells increases the cell sizes and fabrication complexity.

In this invention, we apply the minimal gate length and width of a MOSFET in the conventional CMOS process to form the floating gate and the source/drain electrodes of flash EEPROM device. Without adding extra process steps from the conventional CMOS process baseline, the control gate of the flash EEPROM device formed by a shallow semiconductor embedded in the silicon substrate (well) with its type opposite to the type of the substrate (well) is capacitively coupled through an insulation dielectric to the extended floating gate.

SUMMARY OF THE INVENTION

Scalable Gate Logic Non-Volatile Memory (SGLNVM) devices are fabricated with standard CMOS process. The gate length of the floating gate of SGLNVM is defined by the minimal gate length of a logic process technology node. The minimal gate length of a logic process node is the feature size of the process technology node denoted by "F". The minimal gate width of a. MOSFET device is usually given by the minimal active area width of the process technology node. Thus the minimal floating gate length and minimal active area width of SGLNVM form the minimal channel length and width of the floating gate Metal-Oxide-Semiconductor Field Effect Transistor (MOSFET). The floating gate with the minimal length floating gate extends over a silicon active area forming a capacitive coupling between the floating gate and the control gate embedded in silicon substrate (well) by an insulation dielectric 219. The embedded control gate is formed by a shallow semiconductor type opposite to the type of the silicon substrate (well). The shallow control gate semiconductors are done by N-type ion implantation in P-type substrate or by P-type ion implantation in N-type well such that the depths of the junctions are above the bottom of the field isolation. In one embodiment the ion implantation for N-type SGLNVM can be incorporated in the threshold voltage ion implantation for the P-type MOSFET using the same masking layer in the conventional CMOS process. The ion implantation for P-type SGLNVM can be incorporated in the threshold voltage ion implantation for the N-type MOSFET using the same masking layer in the conventional CMOS process.

Plurality of SGLNVM devices are configured into a NOR-type flash array where a pair of SGLNVM devices with the sharing source electrodes connected to a common ground line and the two drain electrodes connected to two separate bitlines. The pairs of the NOR-type SGLNVM cells are physically separated and electrically isolated by dummy floating gates. FIG. 2a is the top view of the N-type SGLNVM flash array. FIG. 2b and FIG. 2c are the cross-section view of cut "A1" and "B1" in FIG. 2a, respectively. The schematic of m×n N-type SGLNVM array is shown in FIG. 2d. For example, a pair $P_p$ of NOR-type SGLNVM devices in FIG. 2d share the source electrode connected to a common ground line G with their drain electrodes connected to their correspondent bitlines $B_p$ and $B_{p+1}$.

The N-type SGLNVM array receives the same P-type well ion implants, N-type Lightly Doped Drain (LDD) and P-type pocket ion implants, and high dosage of N-type source/drain ion implants for N-type MOSFET in conventional CMOS process. Since the P-type well implants, N-type Lightly Doped Drain (LDD) and P-type pocket implants, and high dosage of N-type source/drain have been tuned to meet the short channel margin for N-type MOSFETs in the conventional CMOS process, the N-type SGLNVM devices upon receiving the same implants would have the similar short channel margin performance. The only major differences are that the SGLNVM devices have inferior drain driving currents and higher threshold voltages due to the thicker tunneling oxide and capacitive coupling from the channel through the floating gate to the control gate. FIG. 3 shows the short channel margin for SGLNVM device threshold voltage versus the floating gate length in a 90% shrink of 0.13 μm standard logic process node. As seen in FIG. 3 the threshold voltage roll-off of short channel margin for the SGLNVM devices using the standard process (no extra LDD and pocket implants) holds very well down to the sub-nominal gate length of 0.11 μm. FIG. 4 shows the SGLNVM device drain driving currents versus applied control gate voltage for the erased and programmed cells under one single erase/programming voltage-bias shot measured from the SGLNVM array shown in FIG. 2.

FIG. 5a shows the top view of the P-type SGLNVM flash array. FIG. 5b and FIG. 5c are the cross section view of cut "A2" and "B2" in FIG. 5a, respectively. As seen in FIG. 5a, the minimal length and minimal width of the floating gate for the P-type SGLNVM devices form the minimal channel length and width of the floating gate Metal-Oxide-Semiconductor Field Effect Transistor (MOSFET). The P-type floating gates with the minimal length floating gates extend over silicon active areas forming a capacitive coupling between the floating gate and the control gate embedded in N-type well by an insulation dielectric 519. The embedded control gate is formed by a shallow P-type semiconductor. The P-type shallow control gate semiconductors are done by P-type ion implantation in N-type well such that the depth of the p/n junction is above the bottom of the field isolation. In one embodiment this ion implantation can be incorporated in the threshold voltage ion implantation for the N-type MOSFET using the same masking layer in the conventional CMOS process. The P-type SGLNVM array receives the same N-type well ion implants, P-type Lightly Doped Drain (LDD) and N-type pocket ion implants, and high dosage of P-type source/drain ion implants as for the P-type MOSFET in the conventional CMOS process.

BRIEF DESCRIPTION OF THE DRAWINGS

For a better understanding of the present invention and to show how it may be carried into effect, reference will now be made to the following drawings, which show the preferred embodiments of the present invention, in which.

DETAILED DESCRIPTION OF THE INVENTION

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 1A:
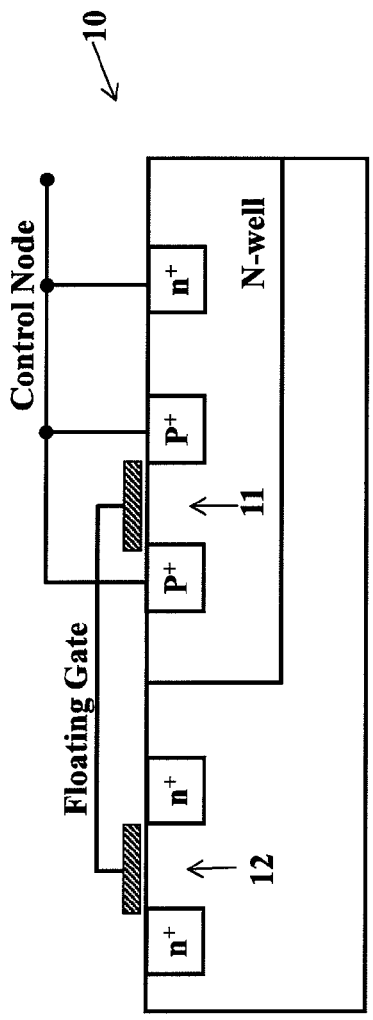
FIG. 1 shows (a) the cross section of original single-poly floating gate NVM device and (b) the schematic of single-poly floating NVM array by Ohsaki et al.
Figure 1B:
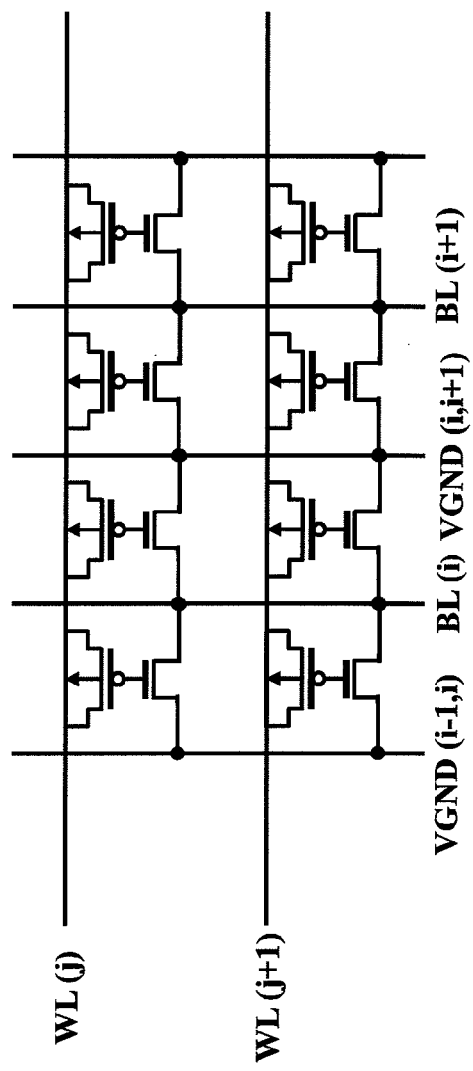
Figure 2A:
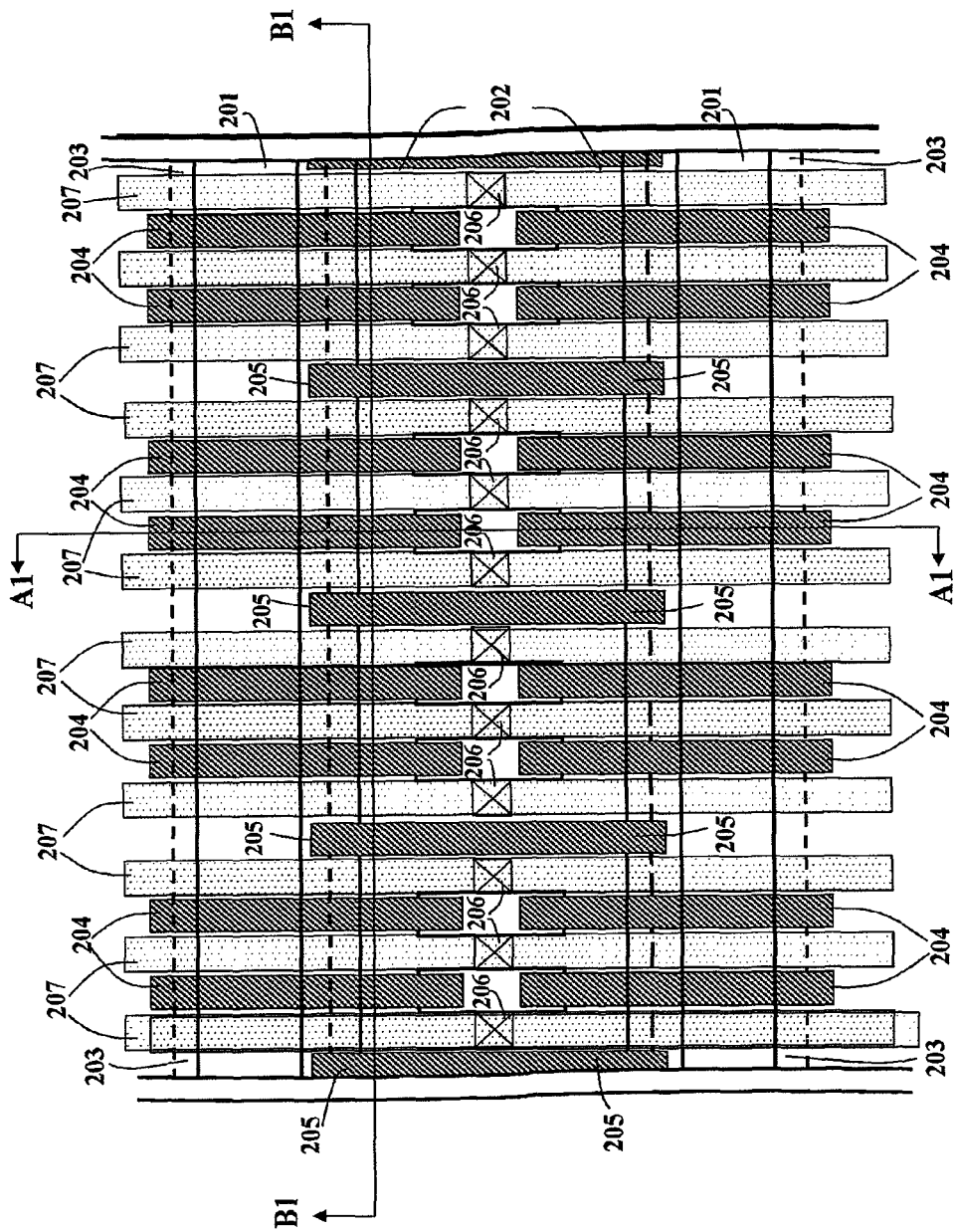
FIG. 2 shows (a) the top view of N-type SGLNVM flash cell array isolated with dummy floating gates; (b) the cross section view of cut line "A1" in FIG. 2a; (c) the cross section view of cut line "B1" in FIG. 2a; (d) the schematic for a m x n SGLNVM flash cell array in one embodiment.
Figure 2B:
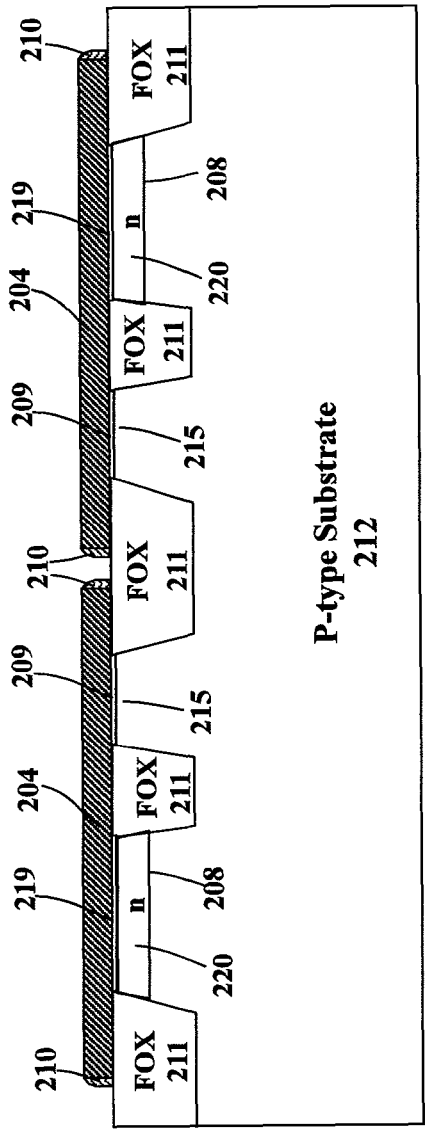
Figure 2C:
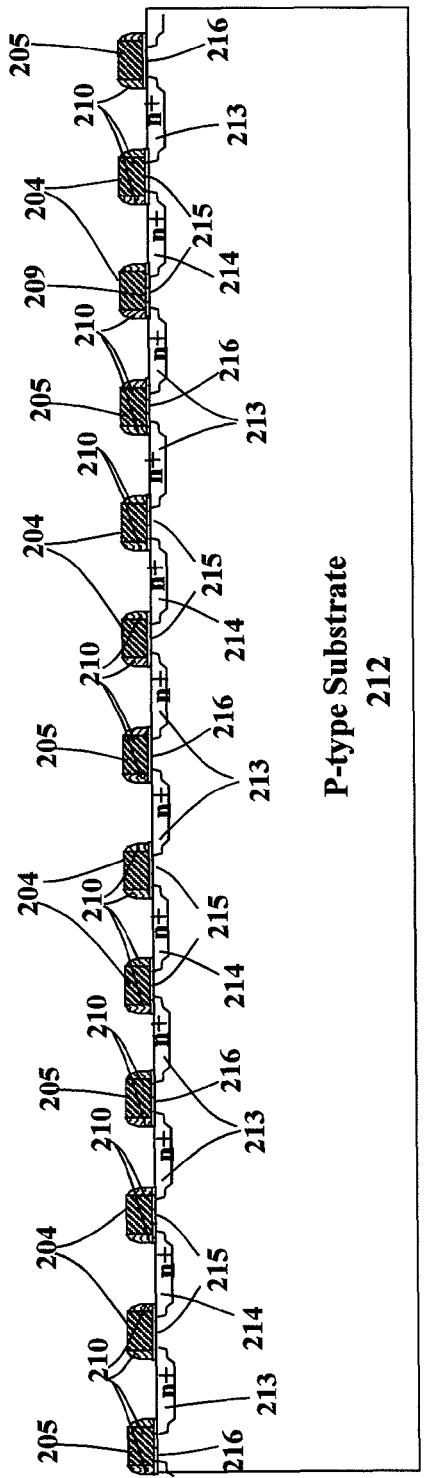
Figure 2D:
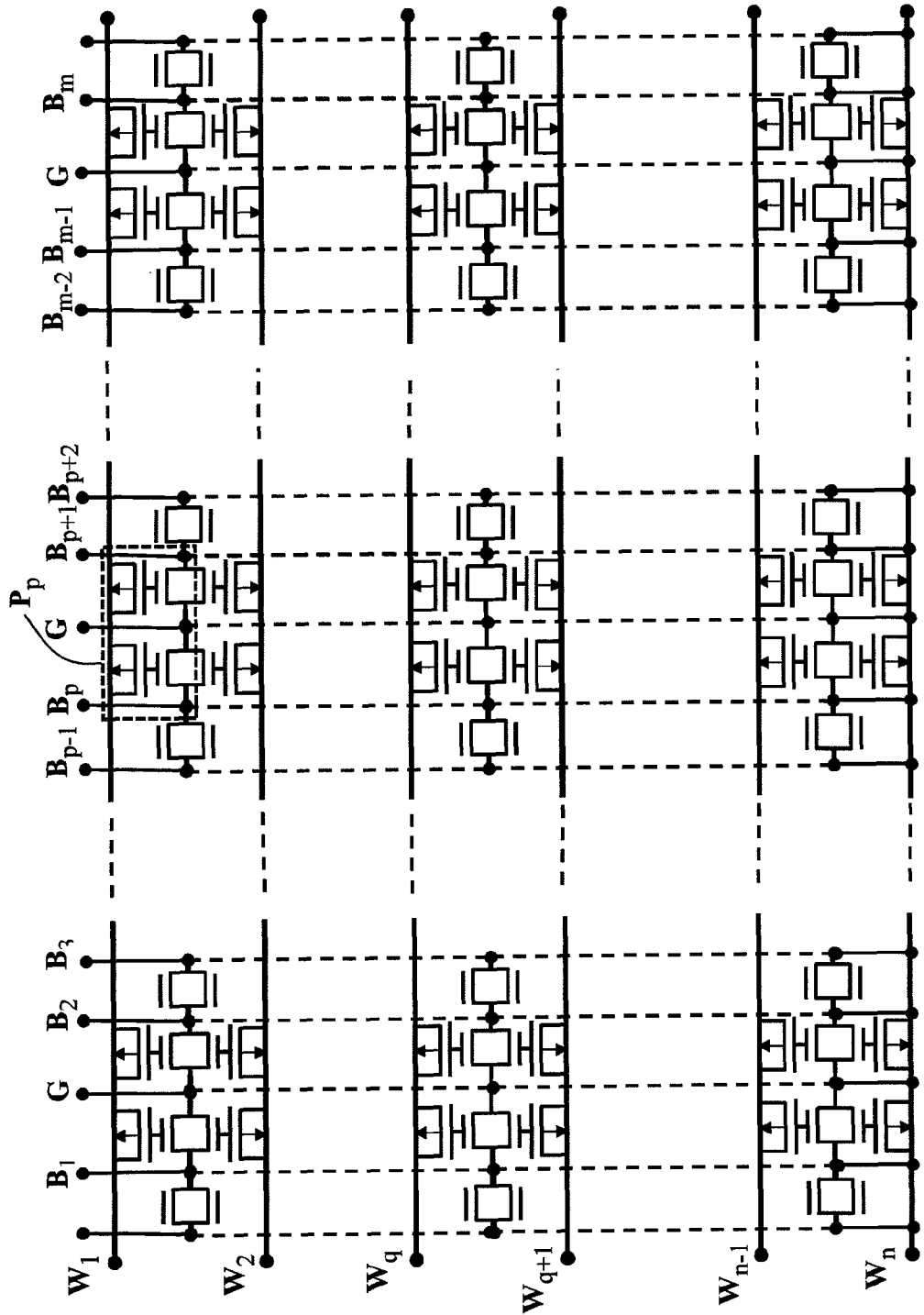
Figure 3:
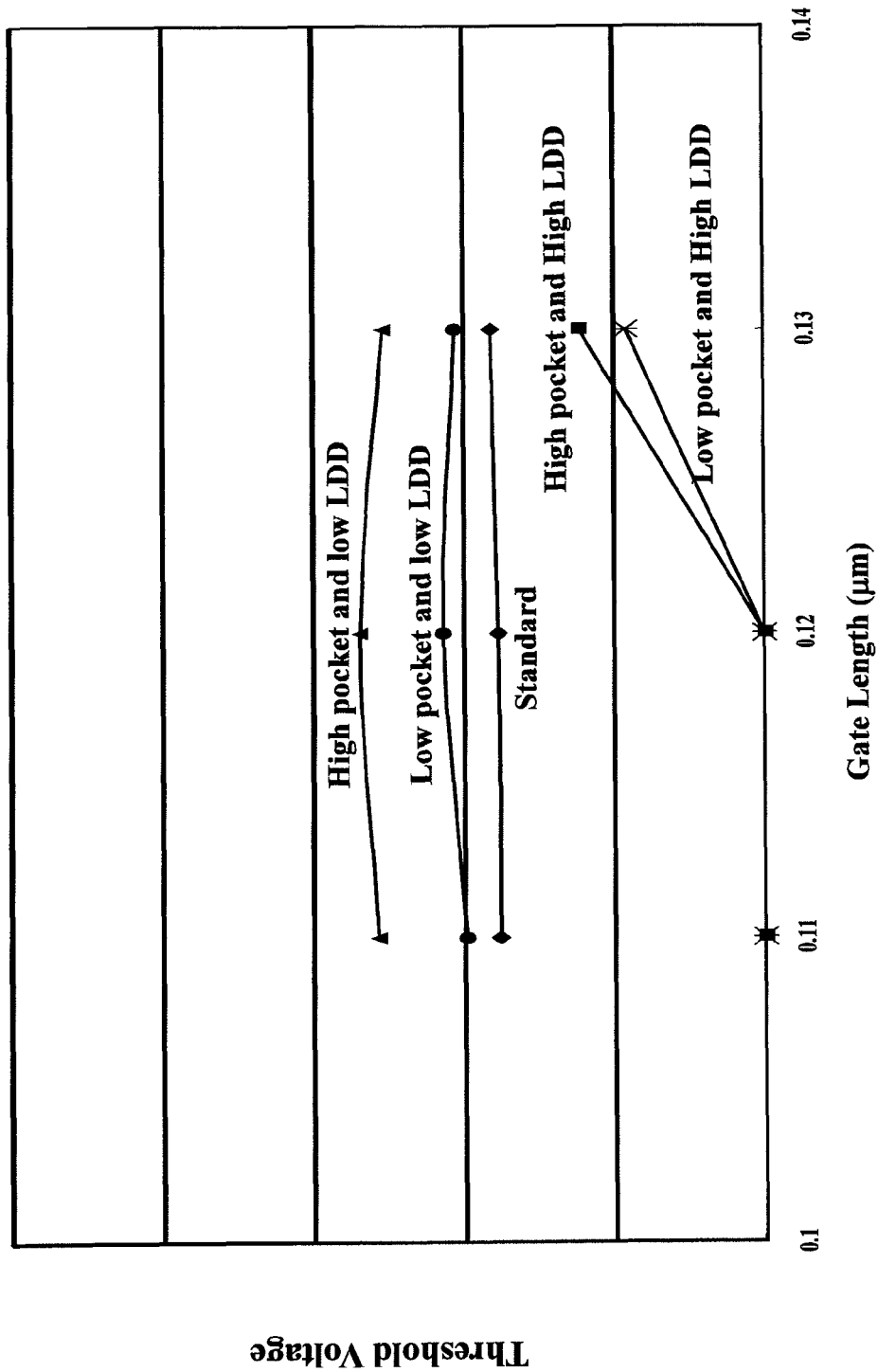
FIG. 3 shows the threshold voltage roll-off versus the floating gate length for the short channel margin of SGLNVM device in a 90% shrink of 0.13 μm standard logic process node.
Figure 4:
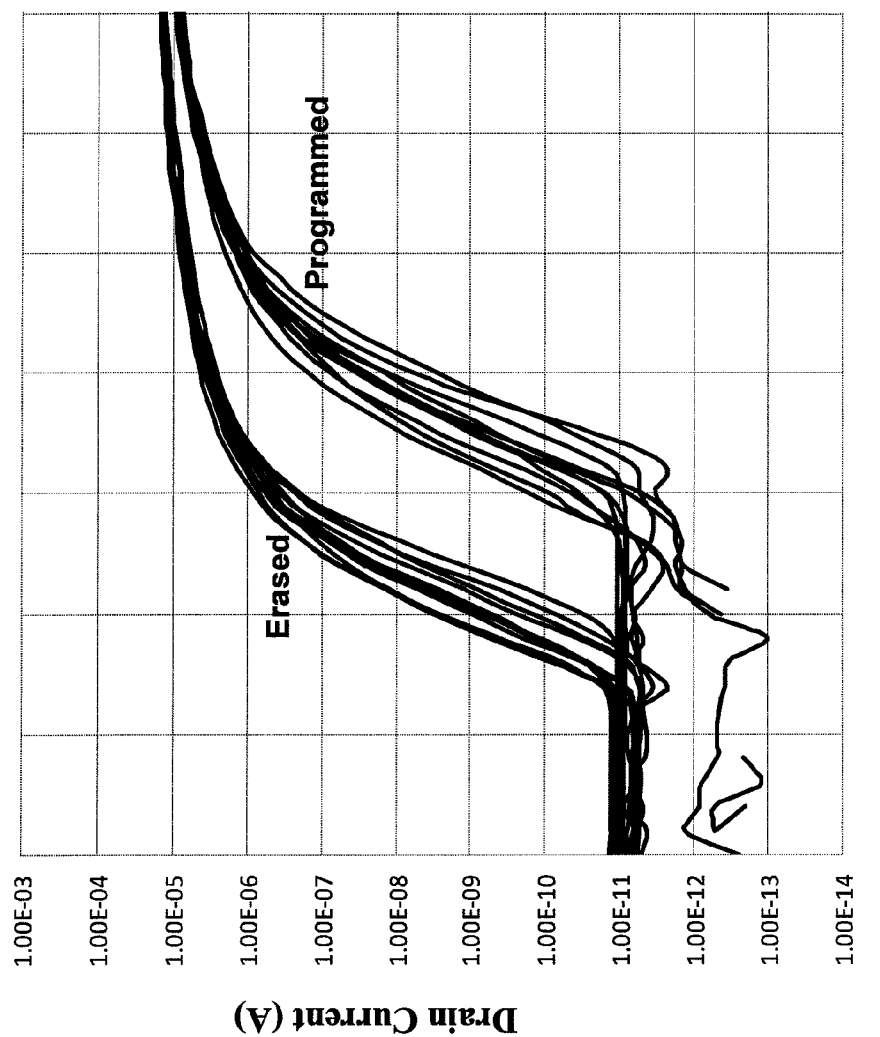
FIG. 4 shows the SGLNVM device drain driving currents versus applied control gate voltage for the erased and programmed cells under one single erase/programming voltage-bias shot measured from the SGLNVM flash array shown in FIG. 2.

In one embodiment of this invention, dummy floating gates 205 are applied to separate pairs of N-type NOR SGLNVM cell devices in the flash array. FIG. 2a is the top view of the N-type NOR SGLNVM flash cell array. Two active areas 201 and an active area 202 in the shape of three rows defining the wordline areas and source/drain electrode areas respectively are processed by Shallow Trench Isolation (STI) module in the conventional CMOS process. The width of areas 202 is preferred drawn to be the minimal width of the process capability to minimize the device size. As in the conventional CMOS process, a series of N-type well and P-type well implants are performed. Areas 203 are the open areas to receive shallow N-type implants such that the depths of the shallow n/p junction 208 formed with the P-type substrate 212 are above the bottom of STI 211. Depending on the detailed CMOS process and the requirement for the wordline (linked NVM cells' control gates 220) resistance in the array, the N-type implants can be incorporated with the threshold voltage and punch-through implants for P-type MOSFET in conventional CMOS process. After well implants for both P-type and N-type MOSFETs, different thickness gate oxides including tunneling oxide 209 and isolation dielectric 219 are grown and a poly-crystalline silicon film are deposited, patterned, and etched to form the floating gates 204 and 205 in the array, and the gates of other regular MOSFETs. The widths of the floating gates 204 are preferred to be the minimal width of the process capability to minimize the device size. The floating gates 204 overlap the active areas 202 to form the minimal channel lengths and widths 215 of N-type floating gate MOSFETs. Two floating gate MOSFETs are paired to share the common source electrodes 214. The dummy floating gates 205 overlap the active areas 202 to form the P-type channel stop areas 216 to separate the neighboring N-type drain electrodes 213. Lightly Doped Drain (LDD) and pocket implants are then performed before the nitride spacer 210 formation. After receiving high dosage N-type source/drain electrode implant, thermal activation, and salicide formation, the front-end process of the N-type SGLNVM device array is complete. The source/drain electrodes 214 and 213 of N-type GLNVM devices are connected to metal lines 207 through contacts 206. The correspondent wordlines, common source lines, and bitlines for the N-type SGLNVM flash array in FIG. 2a are shown in the m×n schematic in FIG. 2d.

Figure 5A:
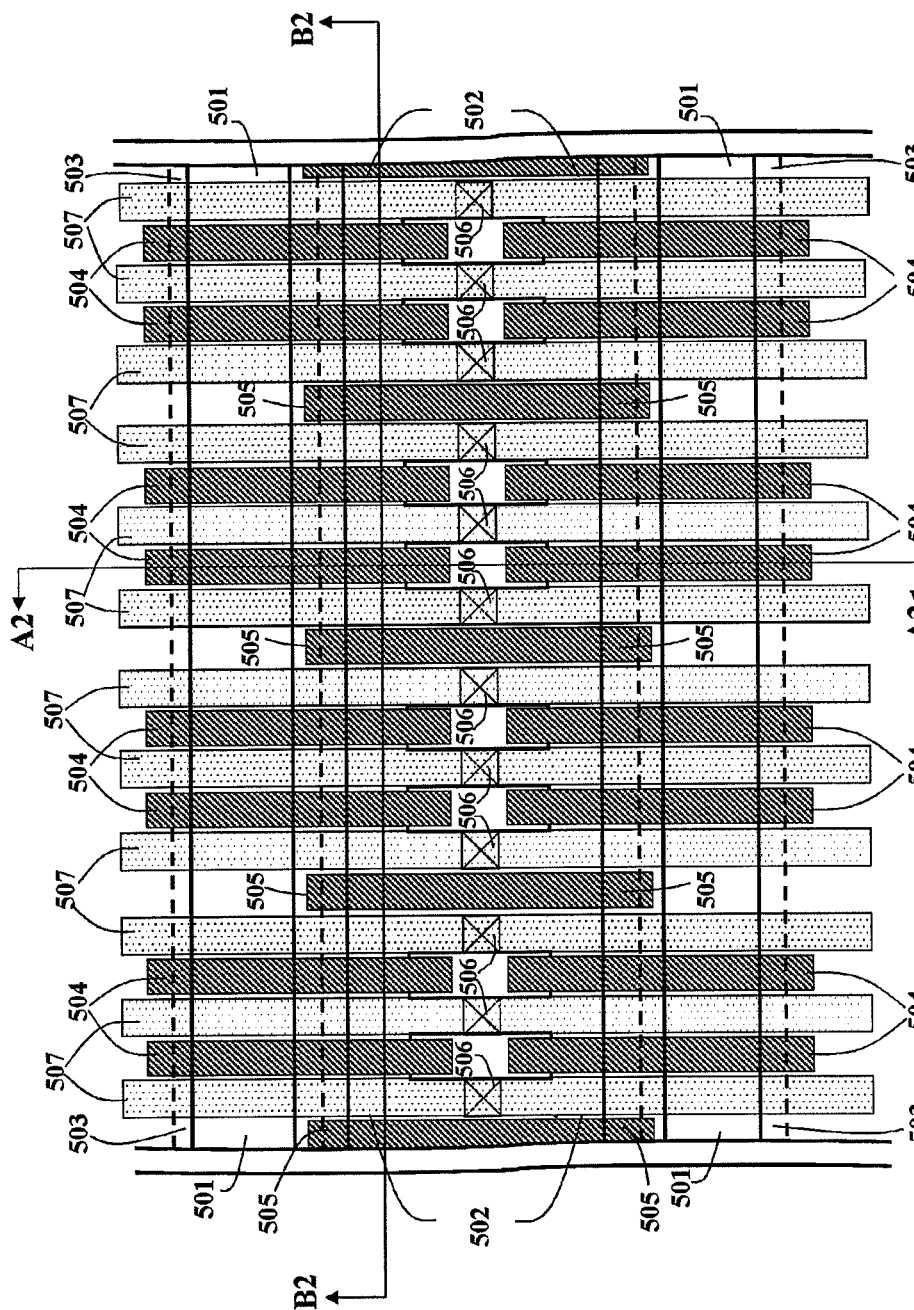
FIG. 5 shows (a) the top view of P-type SGLNVM cell flash array isolated with dummy floating gates; (b) the cross section view of cut line "A2" in FIG. 5a; (c) the cross section view of cut line "B2" in FIG. 5a; (d) the schematic for a m×n P-type SGLNVM flash array in one embodiment.
Figure 5B:
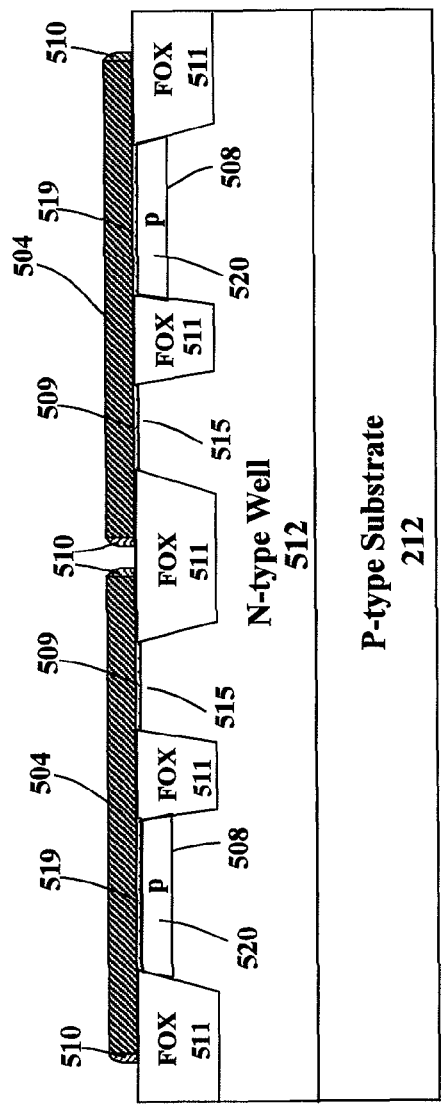
Figure 5C:
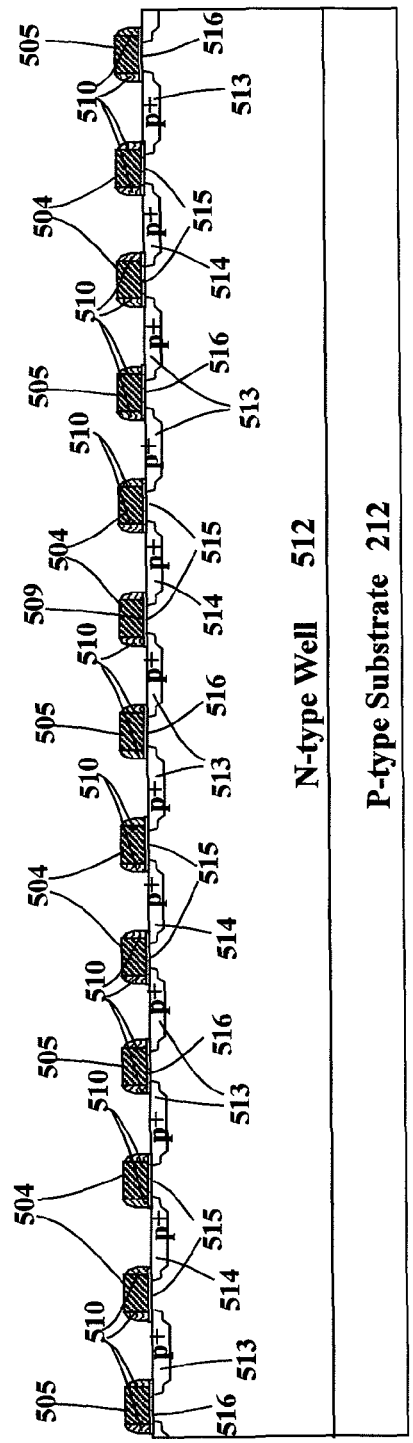
Figure 5D:
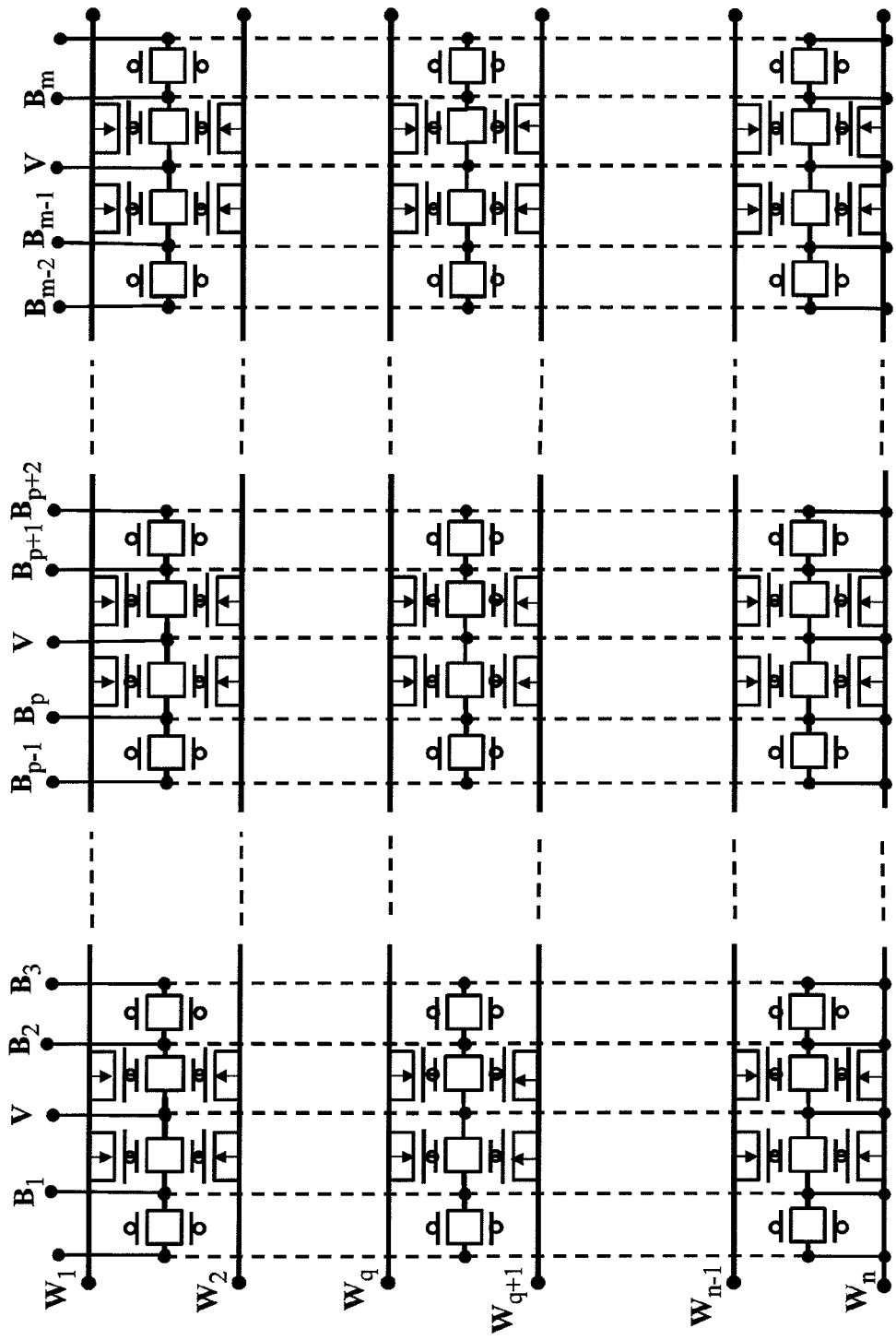

In one embodiment of this invention, dummy floating gates 505 are applied to separate pairs of P-type NOR SGNVM cell devices in the flash array. FIG. 5a is the top view of the P-type NOR SGLNVM flash array. Two active areas 501 and an active area 502 in the shape of three rows defining the wordline areas and source/drain electrode areas respectively are processed by Shallow Trench Isolation (STI) module in the conventional CMOS process. The width of areas 502 is preferred drawn to be the minimal width of the process capability to minimize the device size. As in the conventional CMOS process, a series of N-type well and P-type well implants are performed. Areas 503 are the open areas to receive shallow P-type implants such that the depths of the shallow p/n junction 508 formed with the N-type well 512 are above the bottom of STI 511. Depending on the detailed CMOS process and the requirement of the wordline (Linked NVM cells' control gates 520) resistance in the array, the P-type implants can be incorporated with the threshold voltage and punch-through implants for N-type MOSFET in conventional CMOS process. After the well implants for both P-type and N-type MOSFETs, different thickness gate oxides including tunneling oxide 509 and isolation dielectric 519 are grown and a poly-crystalline silicon film are deposited, patterned, and etched to form the floating gates 504 and 505 in the array, and the gates of other regular MOSFETs. The widths of the floating gates 504 are preferred to be the minimal width of the process capability to minimize the device size. The floating gates 504 overlap the active areas 502 to form the minimal channel lengths and widths 515 of P-type floating gate MOSFETs. Two floating gate MOSFETs are paired to share the common source electrodes 514. The dummy floating gates 505 overlapping the active areas 502 to form the N-type channel stop areas 516 to separate the neighboring P-type drain electrodes 513. Lightly Doped Drain (LDD) and pocket implants are then performed before the nitride spacer 510 formation. After receiving high dosage P-type source/drain electrode implant, thermal activation, and salicide formation, the front-end process of the P-type SGLNVM device array is complete. The source/drain electrodes 514 and 513 of P-type SGLNVM devices are then connected to metal lines 507 through contacts 506. The correspondent wordlines ($W_i$), common source lines (V), and bitlines ($B_j$) for the P-type SGLNVM flash array in FIG. 5a are shown in the m×n array schematic in FIG. 5d.

Figure 6A:
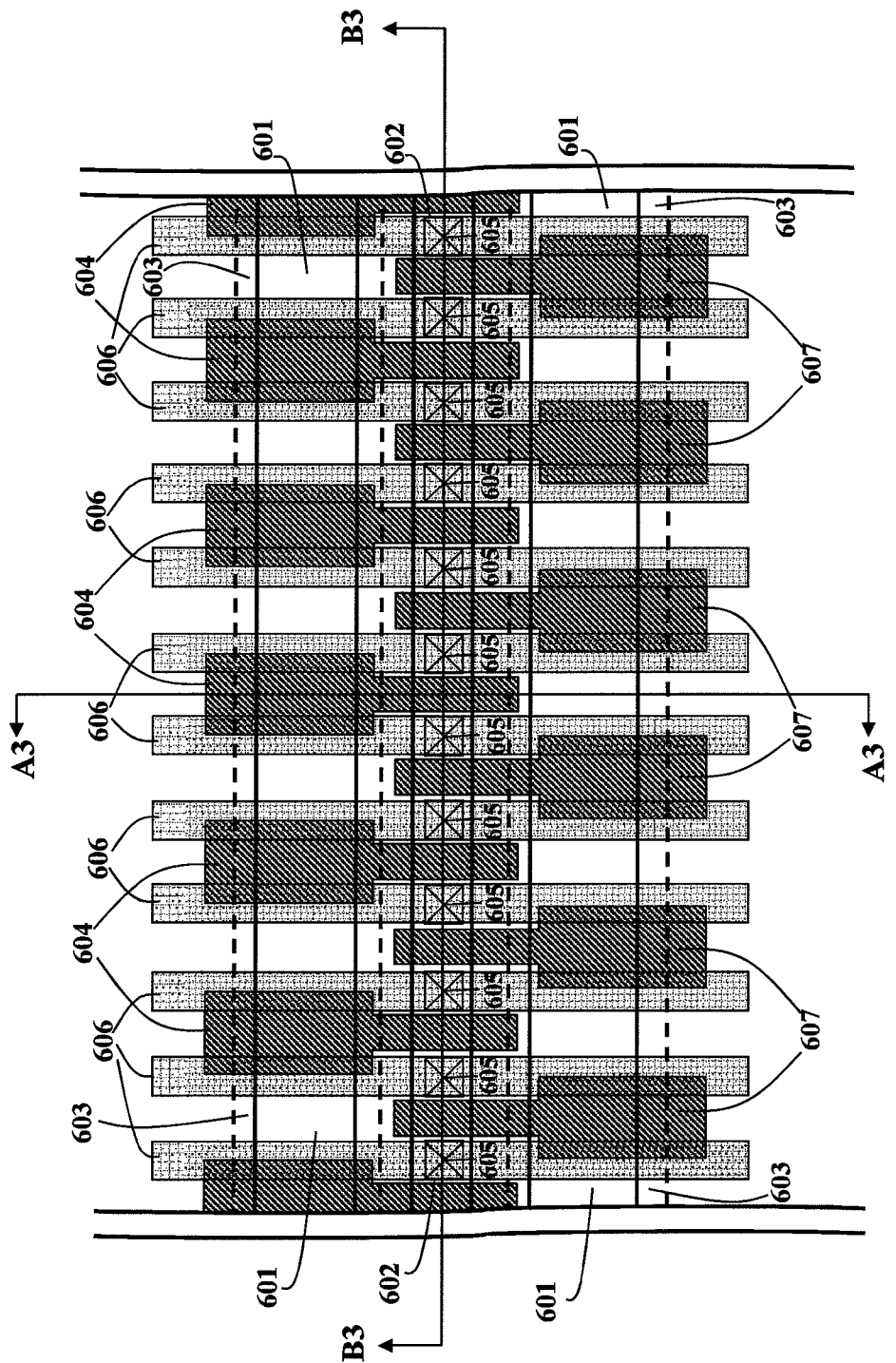
FIG. 6 shows (a) the top view of N-type staggered SGLNVM flash array and (b) the cross section view of cut line "A3" in FIG. 6a; (c) the cross section view of cut line "B3" in FIG. 6a; (d) the schematic for a (m/2)×n N-type SGLNVM flash array in one embodiment.
Figure 6B:
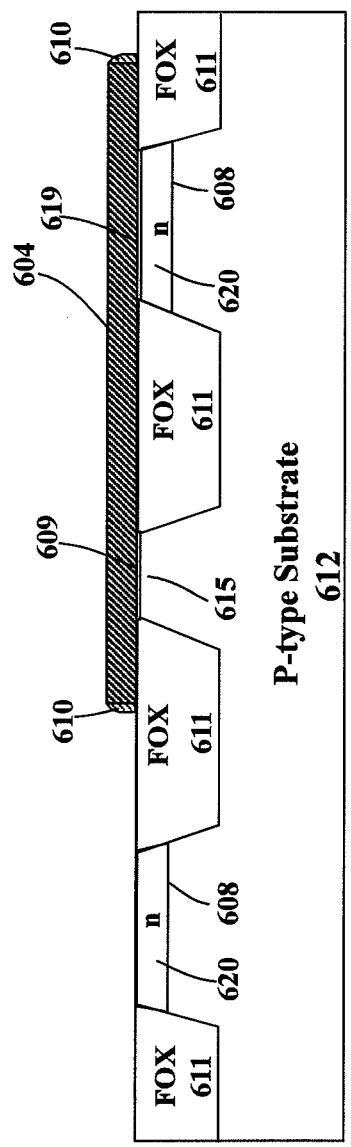
Figure 6C:
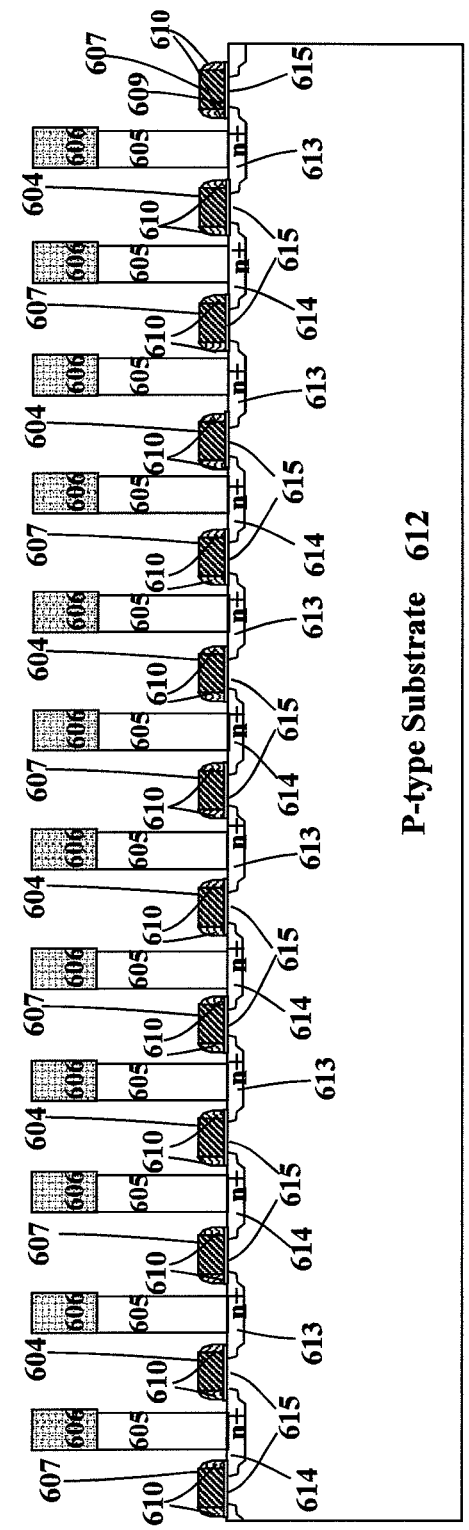
Figure 6D:
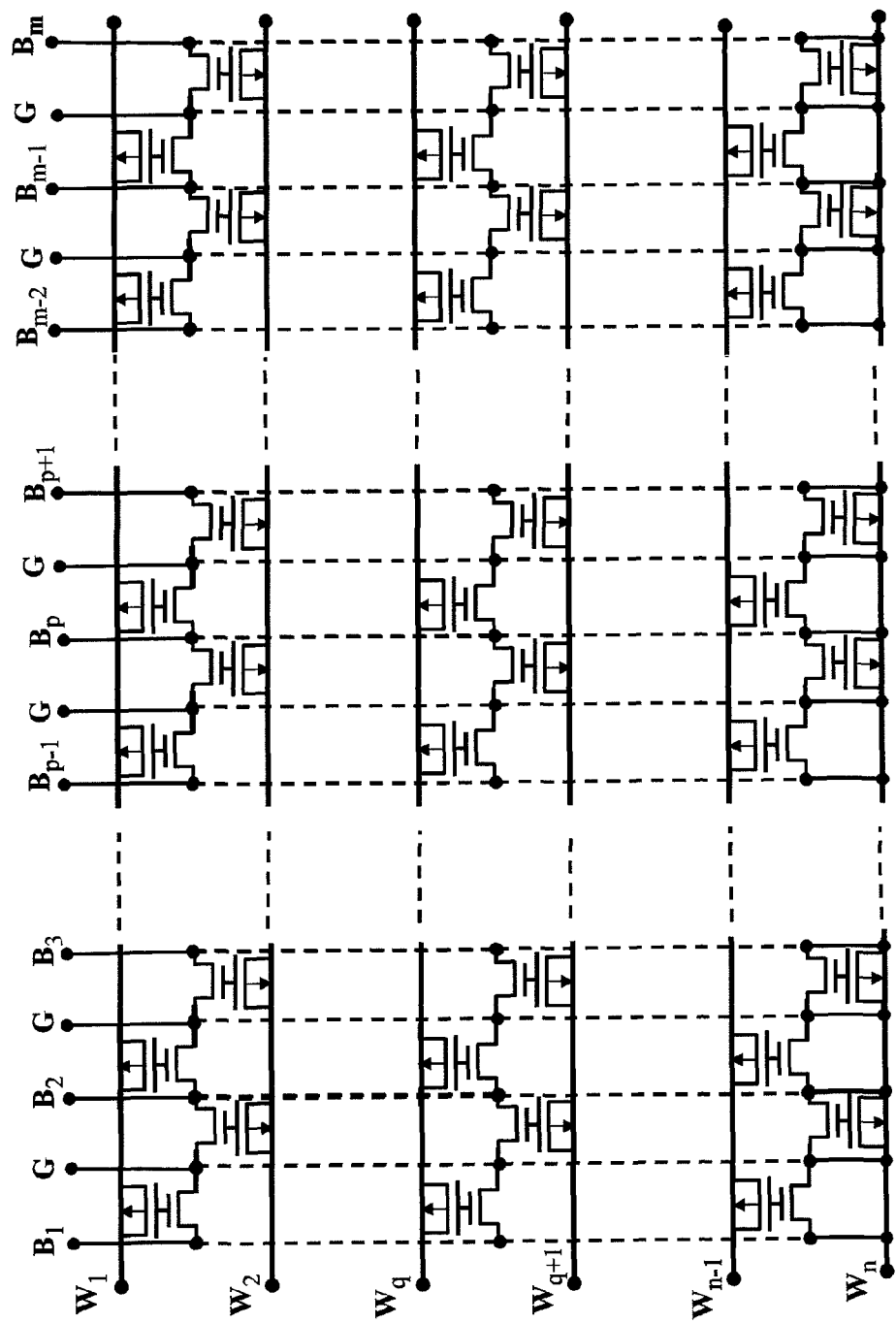

In one embodiment of this invention, the staggered configuration is applied to the N-type NOR SGLNVM cell devices in the flash array. FIG. 6a is the top view of the N-type staggered SGLNVM flash array. Two active areas 601 and an active area 602 in the shape of three rows defining the wordline areas and source/drain electrode areas respectively are processed by Shallow Trench Isolation (STI) module in the conventional CMOS process. The width of areas 602 is preferred drawn to be the minimal width of the process capability to minimize the device size. As in the conventional CMOS process, a series of N-type well and P-type well implants are performed. Areas 603 are the open areas to receive shallow N-type implants such that the depths of the shallow n/p junctions 608 formed with the P-type substrate 612 are above the bottom of STI 611. Depending on the detailed CMOS process and the requirement of the wordline (linked NVM cells' control gates 620) resistance in the array, the N-type implants can be incorporated with the threshold voltage and punch-through implants for P-type MOSFETs in the conventional CMOS process. After well implants for both P-type and N-type MOSFETs, different thickness gate oxides including tunneling oxide 609 and isolation dielectric 619 are grown and a poly-crystalline silicon film are deposited, patterned, and etched to form the floating gates 604 and 607 in the array, and the gates of other regulator MOSFETs. The widths of the floating gates 604 and 607 are preferred to be the minimal width of the process capability to minimize the device size. The floating gates 604 and 607 overlap the active areas 602 to form the minimal channel lengths and widths 615 of N-type floating gate MOSFETs. The floating gates 604 and 607 are staggered each other overlapping with their control gates 620 placed up and down forming two separated wordlines. When the wordline for the floating gates 604 is selected and the other wordline for floating gates 607 is unselected, the SGLNVM devices for floating gates 604 are activated and the SGLNVM devices for floating gates 607 are "off" to detach the SGLNVM devices from the shared source electrodes 613 and the shared drain electrodes 614, and vice versa. The schematic of the (m/2) x n array is shown in FIG. 6d to illustrate the staggered pairs sharing the source/drain electrodes and their correspondent source lines (G) and bitlines ($B_j$).

Lightly Doped Drain (LDD) and pocket implants are then performed before the nitride spacer 610 formation. After receiving high dosage N-type source/drain electrode implant, thermal activation, and salicide formation, the front-end process of the N-type staggered SGLNVM device array is complete. The source/drain electrodes 613 and 614 of N-type SGLNVM devices are connected to metal lines 606 through contacts 605. The correspondent wordlines ($W_i$), common source lines (G), and bitlines ($B_j$) for the N-type staggered SGLNVM flash array in FIG. 6a are shown in the schematic in FIG. 6d.

Figure 7A:
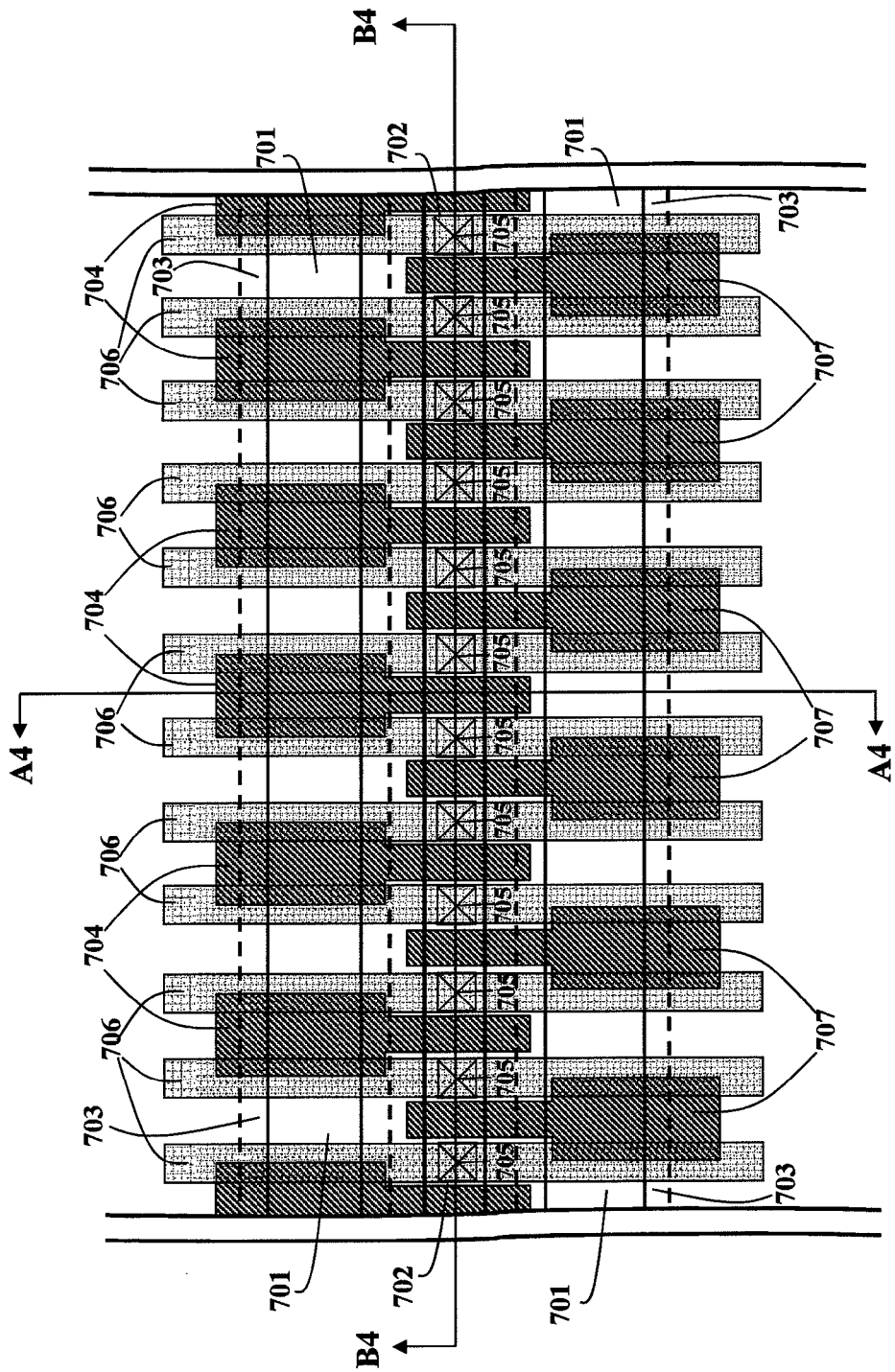
FIG. 7 shows (a) the top view of P-type staggered SGLNVM flash array and (b) the cross section view of cut line "A4" in FIG. 7a; (c) the cross section view of cut line "B4" in FIG. 7a; (d) the schematic for a (m/2)×n P-type SGLNVM flash array in one embodiment.
Figure 7B:
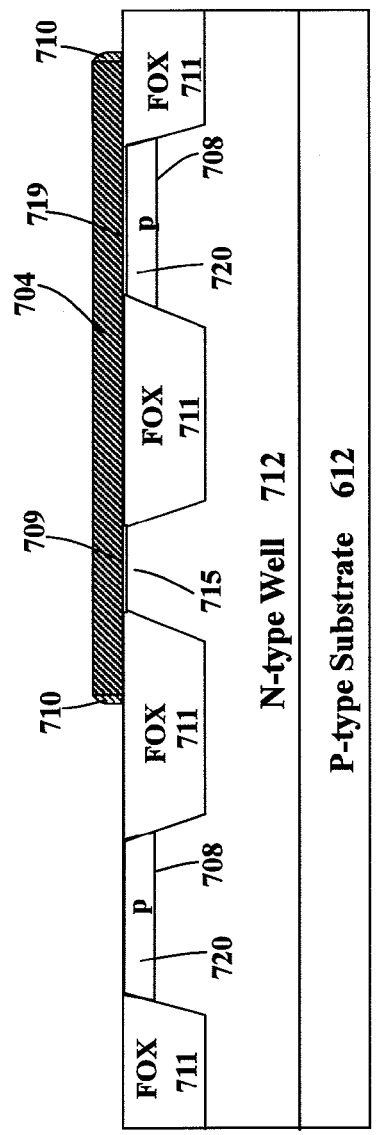
Figure 7C:
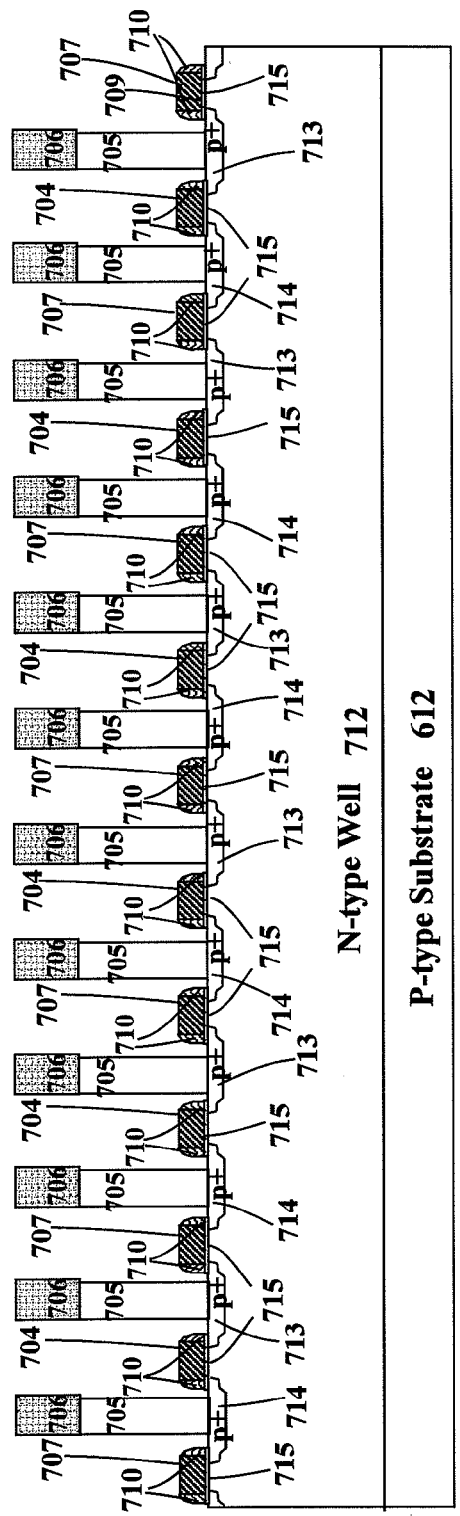
Figure 7D:
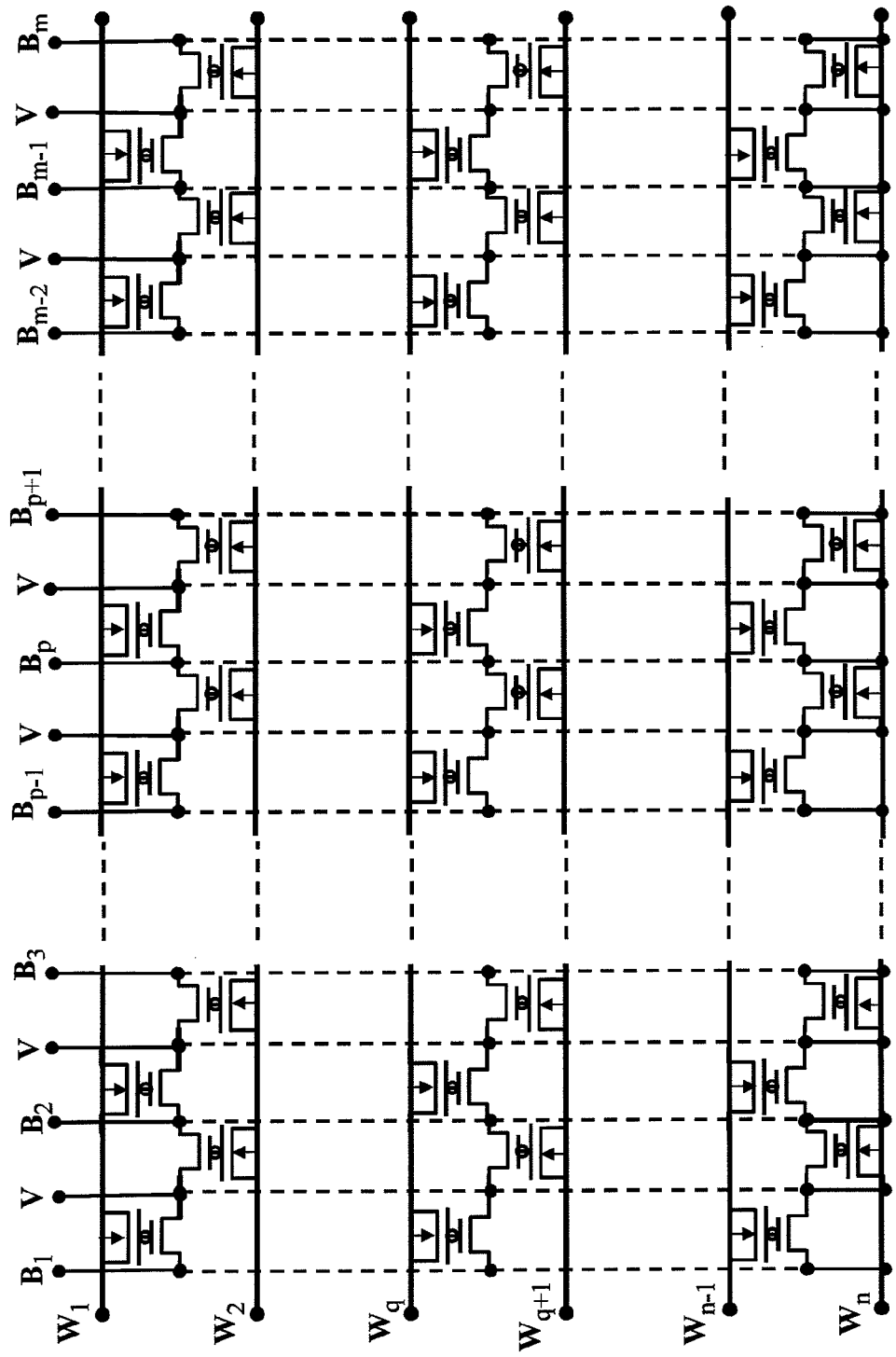

In one embodiment of this invention, the staggered configuration is applied to the P-type NOR SGNVM cell devices in the flash array. FIG. 7a is the top view of the P-type staggered SGLNVM flash array. Two active areas 701 and an active area 702 in the shape of three rows defining the wordline areas and source/drain electrode areas respectively are processed by Shallow Trench Isolation (STI) module in the conventional CMOS process. The width of areas 702 is preferred drawn to be the minimal width of the process capability to minimize the device size. As in the conventional CMOS process, a series of N-type well and P-type well implants are performed. Areas 703 are the open areas to receive shallow P-type implants such that the depths of the shallow p/n junctions 708 formed with the N-type well 712 are above the bottom of STI 711. Depending on the detailed CMOS process and the requirement of the wordline (linked NVM cells' control gates 720) resistance in the array, the P-type implants can be incorporated with the threshold voltage and punch-through implants for N-type MOSFETs in the conventional CMOS process. After well implants for both P-type and N-type MOSFETs, different thickness gate oxides including tunneling oxide 709 and isolation dielectric 719 are grown and a poly-crystalline silicon film are deposited, patterned, and etched to form the floating gates 704 and 707 in the array, and the gates of other regular MOSFETs. The widths of the floating gates are preferred to be the minimal width of the process capability to minimize the device size. The floating gates 704 and 707 overlap the active areas 702 to form the minimal channel lengths and widths 715 of P-type floating gate MOSFETs. The floating gates 704 and 707 are staggered each other overlapping with their control gates 720 placed up and down forming two separated wordlines. When the wordline for the floating gates 704 is selected and the other wordline for floating gates 707 is unselected, the SGLNVM devices for floating gates 704 are activated and the SGNVM devices for floating gates 707 are "off" to detach the SGLNVM devices from the shared source electrodes 713 and the shared drain electrodes 714, and vise versa. The schematic of the (m/2)×n array is shown in FIG. 7d to illustrate the staggered pairs sharing the source/drain electrodes and their correspondent source lines (V) and bitlines ($B_j$).

Lightly Doped Drain (LDD) and pocket implants are then performed before the nitride spacer 710 formation. After receiving high dosage P-type source/drain electrode implant, thermal activation, and salicide formation, the front-end process of the P-type staggered SGLNVM device array is complete. The source/drain electrodes 713 and 714 of P-type SGLNVM devices are connected to metal lines 706 through contacts 705. The correspondent wordlines ($W_i$), common source lines (V), and bitlines ($B_j$) for the P-type staggered SGLNVM flash array in FIG. 7a are shown in the schematic in FIG. 7d.

Figure 8A:
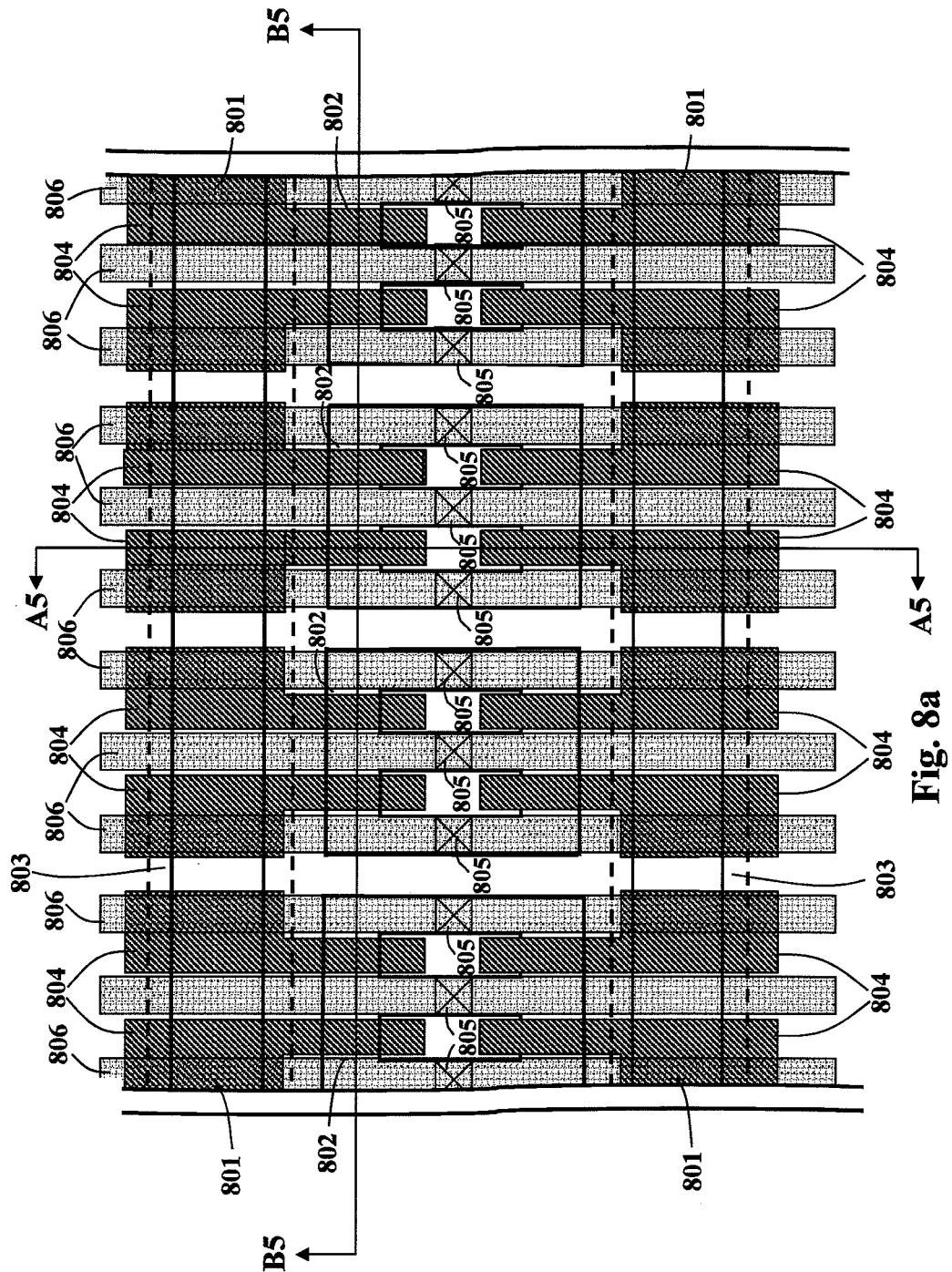
FIG. 8 shows (a) the top view of N-type SGLNVM array with regular field oxide isolations and (b) the cross section view of cut line "A5" in FIG. 8a; (c) the cross section view of cut line "B5" in FIG. 8a; (d) the schematic for a m×n N-type SGLNVM flash array in one embodiment.
Figure 8B:
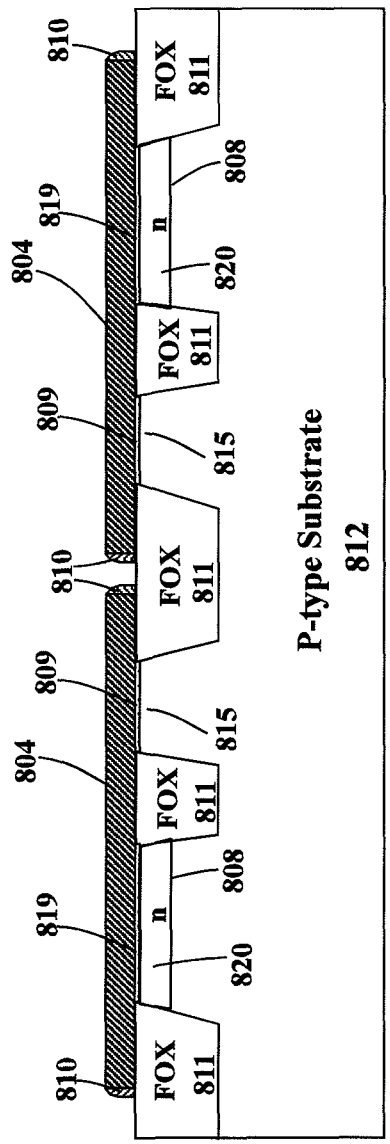
Figure 8C:
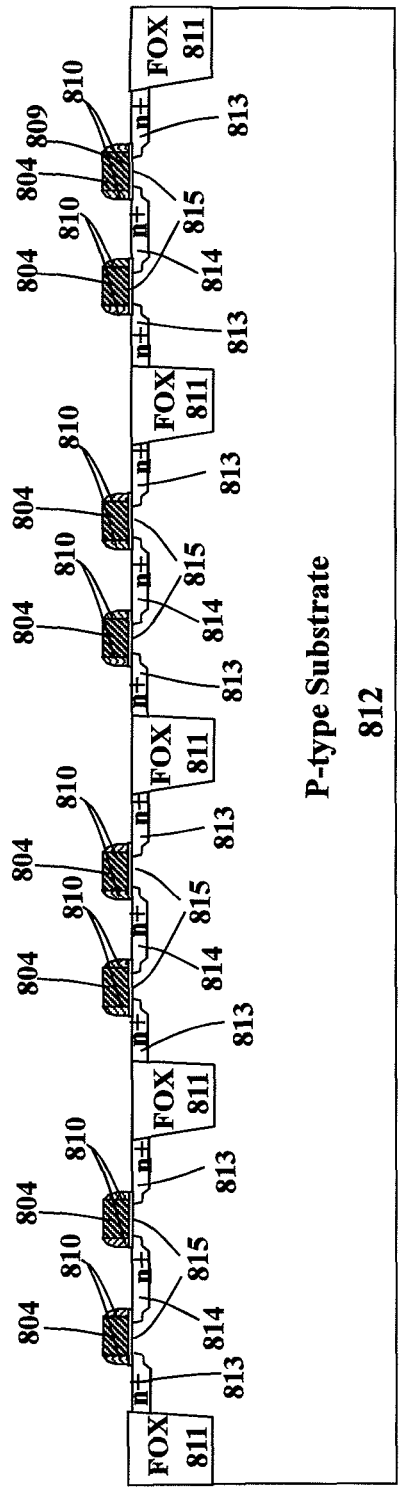
Figure 8D:
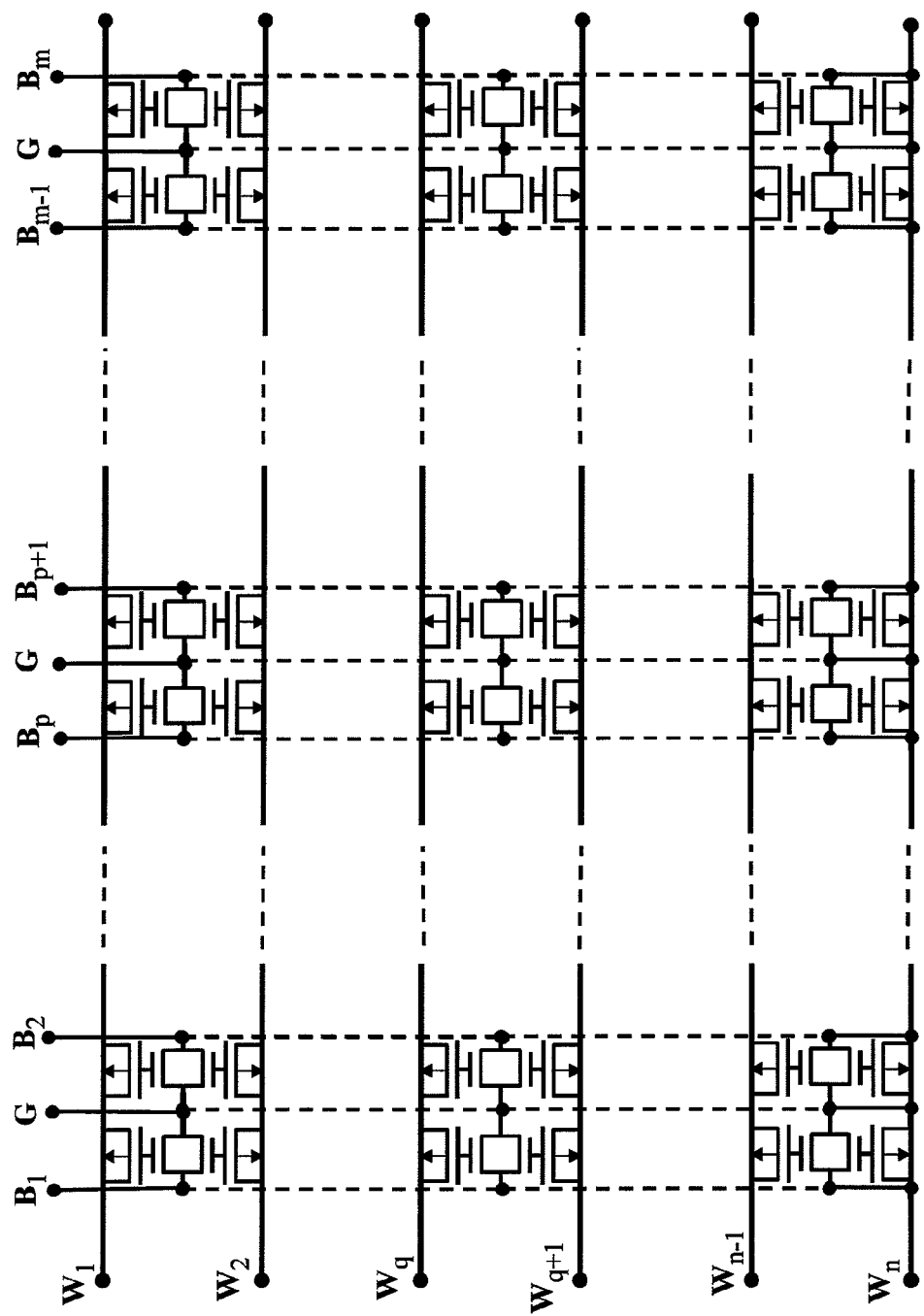

In one embodiment of this invention, field oxides 811 are applied to separate pairs of the N-type NOR SGNVM cell devices in the flash array. FIG. 8a is the top view of the N-type SGLNVM array separated by field oxide. The two active areas 801 in the shape of two rows defining the wordline areas and a row of active areas 802 in the shape of rectangles defining source/drain electrode areas are processed by Shallow Trench Isolation (STI) module in the conventional CMOS process. The width of areas 802 is preferred drawn to be the minimal width of the process capability to minimize the device size. As in the conventional CMOS process, a series of N-type well and P-type well implants are performed. Areas 803 are the open areas to receive shallow N-type implants such that the depths of the shallow n/p junctions 808 formed with the P-type substrate 812 are above the bottom of STI 811. Depending on the detailed CMOS process and the requirement of the wordline (linking NVM cells' control gates 820) resistance in the array, the N-type implants can be incorporated with the threshold voltage and punch-through implants for P-type MOSFETs in the conventional CMOS process. After well implants for both P-type and N-type MOSFETs, different thickness gate oxides including tunneling oxide 809 and isolation dielectric 819 are grown and a poly-crystalline silicon film are deposited, patterned, and etched to form the floating gates 804 in the array, and the gates of other regular MOSFETs. The widths of the floating gates 804 are preferred to be the minimal width of the process capability to minimize the device size. The floating gates 804 overlap the active areas 802 to form the minimal channel lengths and widths 815 of N-type floating gate MOSFETs. Two floating gate MOSFETs are paired to share the common source electrodes 814. The field oxides 811 extending parallel to the bit lines and formed between the active areas 802 are used to separate the neighboring N-type drain electrodes 813 as shown in FIG. 8c. Light Dopedly Drain (LDD) and pocket implants are then performed before the nitride spacer 810 formation. After receiving high dosage N-type source/drain electrode implant, thermal activation, and salicide formation, the front-end process of the N-type SGLNVM device array configured with multiple NOR-pairs separated by field oxides 811 is complete. The source/drain electrodes 814 and 813 of N-type SGLNVM devices are connected to metal lines 806 through contacts 805. The correspondent wordlines ($W_i$), common source lines (G), and bitlines ($B_j$) for the N-type SGLNVM flash array configured with multiple NOR-pairs separated by field oxides 811 in FIG. 8a are shown in the schematic in FIG. 8d.

Figure 9A:
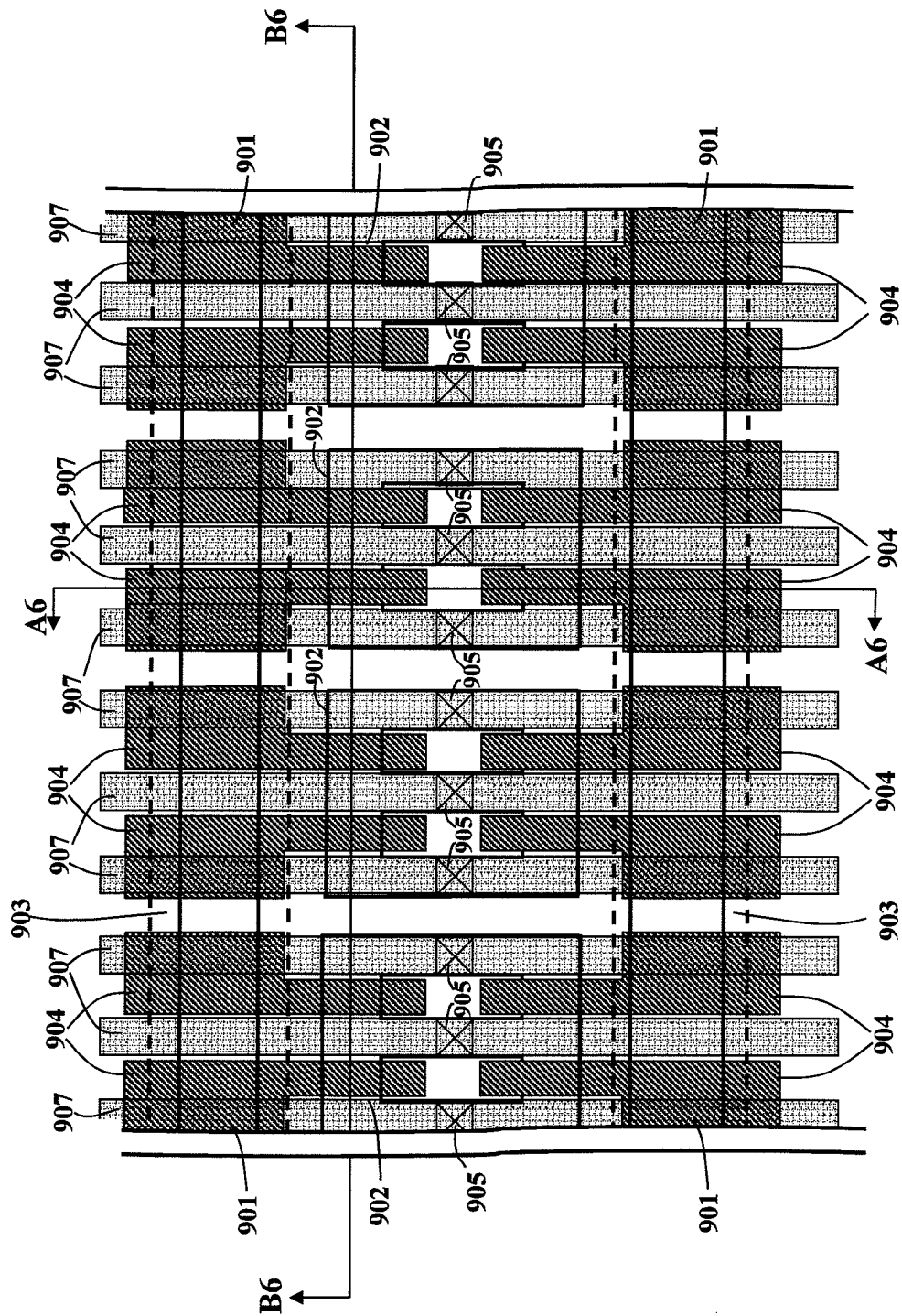
FIG. 9 shows (a) the top view of P-type SGLNVM array with regular field oxide isolations and (b) the cross section view of cut line "A6" in FIG. 9a; (c) the cross section view of cut line "B6" in FIG. 9a; (d) the schematic for a m×n P-type SGLNVM flash array in one embodiment.
Figure 9B:
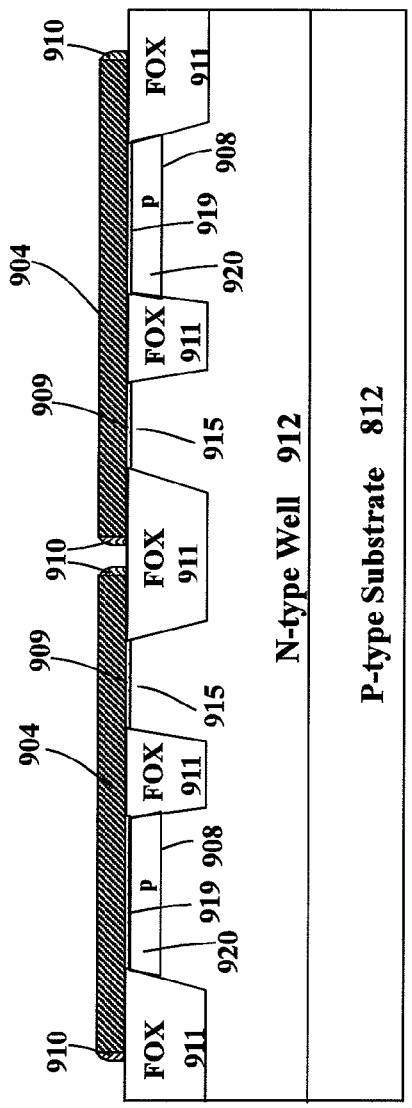
Figure 9C:
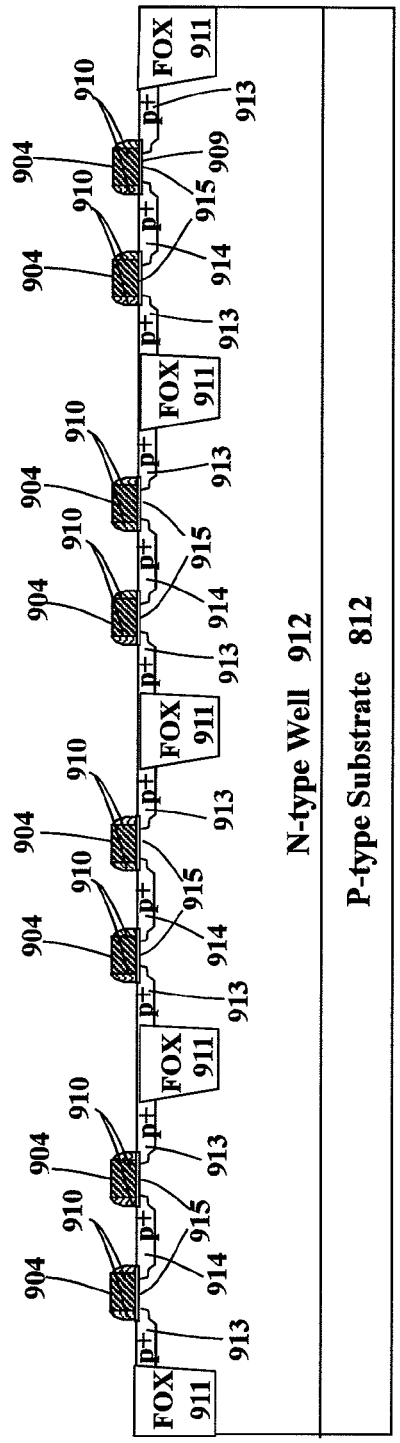
Figure 9D:
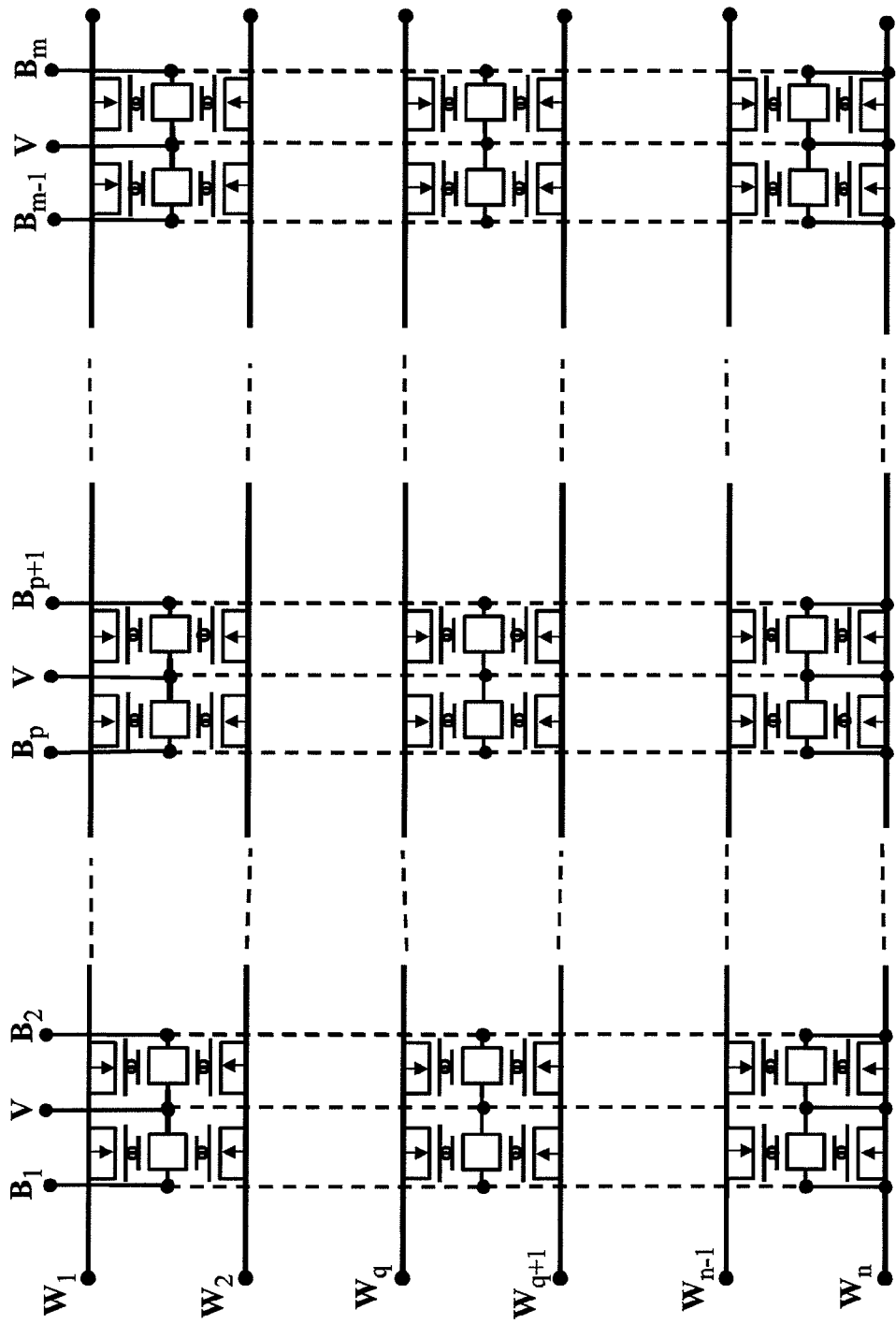

In one embodiment of this invention, field oxides 911 are applied to pairs of the P-type NOR SGLNVM cell devices in the flash array. FIG. 9a is the top view of the P-type SGLNVM flash array separated by field oxide. The two active areas 901 in the shape of two rows defining the wordline areas and a row of active areas 902 in the shape of rectangles defining source/drain electrode areas are processed by Shallow Trench Isolation (STI) module in the conventional CMOS process. The width of areas 902 is preferred drawn to be the minimal width of the process capability to minimize the device size. As in the conventional CMOS process, a series of N-type well and P-type well implants are performed. Areas 903 are the open areas to receive shallow P-type implants such that the depths of the shallow p/n junctions 908 formed with the N-type wells 912 are above the bottom of STI 911. Depending on the detailed CMOS process and the requirement of the wordline (linking NVM cells' control gates 920) resistance in the array, the P-type implants can be incorporated with the threshold voltage and punch-through implants for N-type MOSFETs in the conventional CMOS process. After well implants for both P-type and N-type MOSFETs, different thickness gate oxides including tunneling oxide 909 and isolation dielectric 919 are grown and a poly-crystalline silicon film are deposited, patterned, and etched to form the floating gates 904 in the array, and the gates of other regular MOSFETs. The widths of the floating gates 904 are preferred to be the minimal width of the process capability to minimize the device size. The floating gates 904 overlap the active areas 902 to form the minimal channel lengths and widths 915 of P-type floating gate MOSFETs. Two floating gate MOSFETs are paired to share the common source electrodes 914. The field oxides 911 extending parallel to the bit lines and formed between the active areas 902 are used to separate the neighboring P-type drain electrodes 913 as shown in FIG. 9c, Lightly Doped Drain (LDD) and pocket implants are then performed before the nitride spacer 910 formation. After receiving high dosage P-type source/drain electrode implant, thermal activation, and salicide formation, the front-end process of the P-type SGLNVM device array configured with multiple NOR-pairs separated by field oxides 911 is complete. The source/drain electrodes of P-type SGLNVM devices are connected to metal lines 906 through contacts 905. The correspondent wordlines ($W_j$), common source lines (V), and bitlines ($B_i$) for the P-type SGLNVM flash array configured with multiple NOR-pairs separated by field oxides 911 in FIG. 9a are shown in the schematic of FIG. 9d.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations of geometrical shapes including lengths and widths, gate material or tunneling dielectrics will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array of nonvolatile memory (NVM) cells comprising:
   a plurality of source lines and bit lines; and
   a plurality of NVM cells organized in rows and columns on a substrate, each NVM cell having a source region, a drain region, a floating gate, a control gate region and a channel region, the NVM cells in a row being arranged in cell pairs, such that each cell pair comprises a sharing source region connected to a common source line and two drain regions connected to two different bit lines;
   wherein the floating gate is disposed over and insulated from both the channel region and the control gate region and the floating gate extends parallel to the bit lines from the channel region to the control gate region;
   means for processing the array with CMOS logic;
   wherein the means for processing the array with CMOS logic limits a dimension of the floating gate to a minimal feature size and a minimal active area width of a process technology node; and
   wherein the control gate region, the source region and the drain region have the same conductivity type;
   wherein a control gate length of the array is perpendicular to the bit line.

2. The array according to claim 1, further comprising:
   a plurality of isolation regions in the row so that each isolation region is formed between two adjacent drain regions of any two adjacent cell pairs in the row.

3. The array according to claim 2, wherein the control gates of the NVM cells in the row form a word line perpendicular to the bit lines.

4. The array according to claim 2, wherein the plurality of isolation regions are dummy floating gates and the dummy floating gates do not overlap any word lines, and wherein each of the dummy floating gates is disposed on the substrate and forms a stop area between two adjacent drain regions of any two adjacent cell pairs in the row.

5. The array according to claim 4, wherein gate lengths of the dummy floating gates are limited to the minimal feature size.

6. The array according to claim 2, wherein the plurality of isolation regions are isolation trenches formed in the substrate.

7. The array according to claim 1, wherein the floating gates of the cell pairs in the row are staggered up and down along the bit line direction so that the control gates of upper cells from the cell pairs in the row are connected together to form a upper word line perpendicular to the bit lines, and the control gates of lower cells from the cell pairs in the row are connected together to form a lower word line perpendicular to the bit lines.

8. The array according to claim 1, wherein the control gate region is formed as a shallow semiconductor control gate region.

9. The array according to claim 1, wherein a bottom of the control gate region in the substrate is higher than that of a shallow isolation trench that insulates the control gate region from the channel region.

10. The array according to claim 1, wherein the control gate region has a conductivity type opposite to that of either the substrate or a corresponding well.

11. The array according to claim 1, wherein a gate length of the floating gate is limited to the minimal feature size and a gate width of the floating gate is limited to the minimal active area width.

12. The array according to claim 1, wherein the control gate region is insulated from the floating gate by a dielectric and a capacitive coupling is developed between the floating gate and the control gate region through the dielectric.

13. The array according to claim 1, which is a NOR-type NVM flash array.

14. The array according to claim 1, wherein the control gate region is embedded in a silicon substrate.

15. The array according to claim 14, wherein the control gate region is formed as a shallow semiconductor control gate region in the silicon substrate.

16. The array according to claim 1, wherein the floating gates of the cell pairs in a row are staggered each other along the bit line direction.

17. The array according to claim 1, wherein at least one upper cell and at least one lower cell from the cell pairs in the row are connected to form the at least two different word lines.

* * * * *